United States Patent [19]

Emmart et al.

[11] Patent Number: 5,394,973
[45] Date of Patent: Mar. 7, 1995

[54] SORTER FOR INTEGRATED CIRCUIT DEVICES

[75] Inventors: Scott T. Emmart; Bryan E. Boson; Michael D. Harmon, all of Boise, Id.

[73] Assignee: Micron Technology, Inc., Boise, Id.

[21] Appl. No.: 254,807

[22] Filed: Jun. 6, 1994

[51] Int. Cl.⁶ .............................................. B65G 47/24
[52] U.S. Cl. ................................... 198/399; 198/403; 198/410; 193/46
[58] Field of Search .............. 198/382, 394, 395, 398, 198/399, 400, 402, 403, 410, 417; 193/25 A, 25 FT, 46, 47; 209/540, 541, 544, 545

[56] References Cited
U.S. PATENT DOCUMENTS

| | | | |
|---|---|---|---|
| 2,379,564 | 7/1945 | Cole | 198/399 X |
| 2,967,497 | 1/1961 | Braun et al. | 198/399 X |
| 3,221,857 | 12/1965 | Keller | 198/399 X |
| 3,695,411 | 10/1972 | Tobey et al. | 198/410 |
| 4,995,157 | 2/1991 | Hall | 198/399 X |
| 5,009,305 | 4/1991 | Auld et al. | 198/395 |
| 5,117,963 | 6/1992 | Thayer et al. | 198/395 |
| 5,226,361 | 7/1993 | Grant et al. | 101/44 |

FOREIGN PATENT DOCUMENTS

| | | | |
|---|---|---|---|
| 62-12517 | 1/1987 | Japan | 198/410 |
| 871357 | 10/1981 | U.S.S.R. | 198/399 |

Primary Examiner—Cheryl L. Gastineau
Assistant Examiner—Tuan N. Nguyen
Attorney, Agent, or Firm—Kevin D. Martin

[57] ABSTRACT

A sorter for orienting integrated circuit devices comprises first, second, and third sections. The first section receives the devices and sorts them into those with a leads down orientation and those with a leads up orientation. The first section comprises two opposing faces, each having a pair of lead channels. The first face lead channels receive leads of devices having a leads down orientation, and the second face lead channels receive leads of devices having a leads up orientation. The second section comprises a first channel for receiving devices from the first section having a leads down orientation, and a second channel for receiving devices from the first section having a leads up orientation. The second section further comprises an inverter integral to the second channel for inverting devices passing therethrough to a leads down orientation. The third section comprises a sensor for determining whether the device has a pin one up or a pin one down orientation, a third channel for receiving devices having a pin one up orientation, and a fourth channel for receiving devices having a pin one down orientation. A rotator integral to the fourth channel rotates devices passing therethrough to a pin one up orientation.

21 Claims, 11 Drawing Sheets

SORTER FOR INTEGRATED CIRCUIT DEVICES

FIELD OF THE INVENTION

The invention relates to the field of semiconductor manufacture, and more specifically to a sorter for physically orienting integrated circuit devices.

BACKGROUND OF THE INVENTION

Semiconductor devices such as random and static access memories, microprocessors, and other memory and logic devices, comprise a semiconductor substrate encapsulated in plastic or sealed in ceramic. The devices comprise leads, each of which may have a signal associated therewith. The signals pass between the substrate and an electronic device into which the semiconductor device is installed through the leads.

The semiconductor device must be installed correctly into the electronic device. Each semiconductor device has a top, a bottom (usually the lead side) opposite the top, a front end (usually indicated as the pin one end), a back end opposite the pin one end, a left side and a right it side opposite the left side. If the device is not physically oriented correctly in the electronic device it will not function properly.

During the manufacture of semiconductor devices the devices themselves are typically transported from place to place in transport tubes. The semiconductor devices may also be shipped to the purchaser in tubers, or they can be transported in a tape and reel assembly or in other less common shipping packages. In any case, the proper orientation of the device in the tube or on the tape and reel is critical. Purchasers of the devices conventionally assemble the devices automatically onto printed circuit boards, or into sockets on printed circuit boards. If the devices are not properly oriented in the tube or tape and reel, the purchaser may not assemble the devices correctly onto the printed circuit board or socket.

At various stages of the manufacturing process each device must be tested, which typically requires its removal from the transport tube. Once the device is removed from the tube, it must also be replaced with careful attention to its physical orientation. Done manually, this can be a daunting, time consuming task.

An inexpensive and reliable sorter which would automatically orient a semiconductor device with respect to top, bottom, left, and right would be desirable.

SUMMARY OF THE INVENTION

A sorter for orienting a plurality of integrated circuit devices comprises first, second, and third sections. The first section has an input for receiving the devices. The input comprises first and second opposing faces with a space therebetween for receiving the devices. Each of the faces has a lead channel for receiving leads on one of the devices.

The second section for the passage of the plurality of devices therethrough comprises a first channel for receiving devices received by the lead channel of the first face, and a second channel for receiving devices received by the lead channel of the second face. One of the second section channels comprises means for reorienting the devices passing therethrough, such that after passing through the first channel or the second channel the leads of the plurality of devices face one direction.

The third section for the passage of the plurality of devices therethrough comprises means for determining an orientation of the front end of one of the devices. The third section also comprises a third channel for receiving devices having a front end with a first orientation and a fourth channel for receiving devices having a front end with a second orientation. The third section further comprises means at one of the third section channels for reorienting the front ends of the devices passing therethrough.

Objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
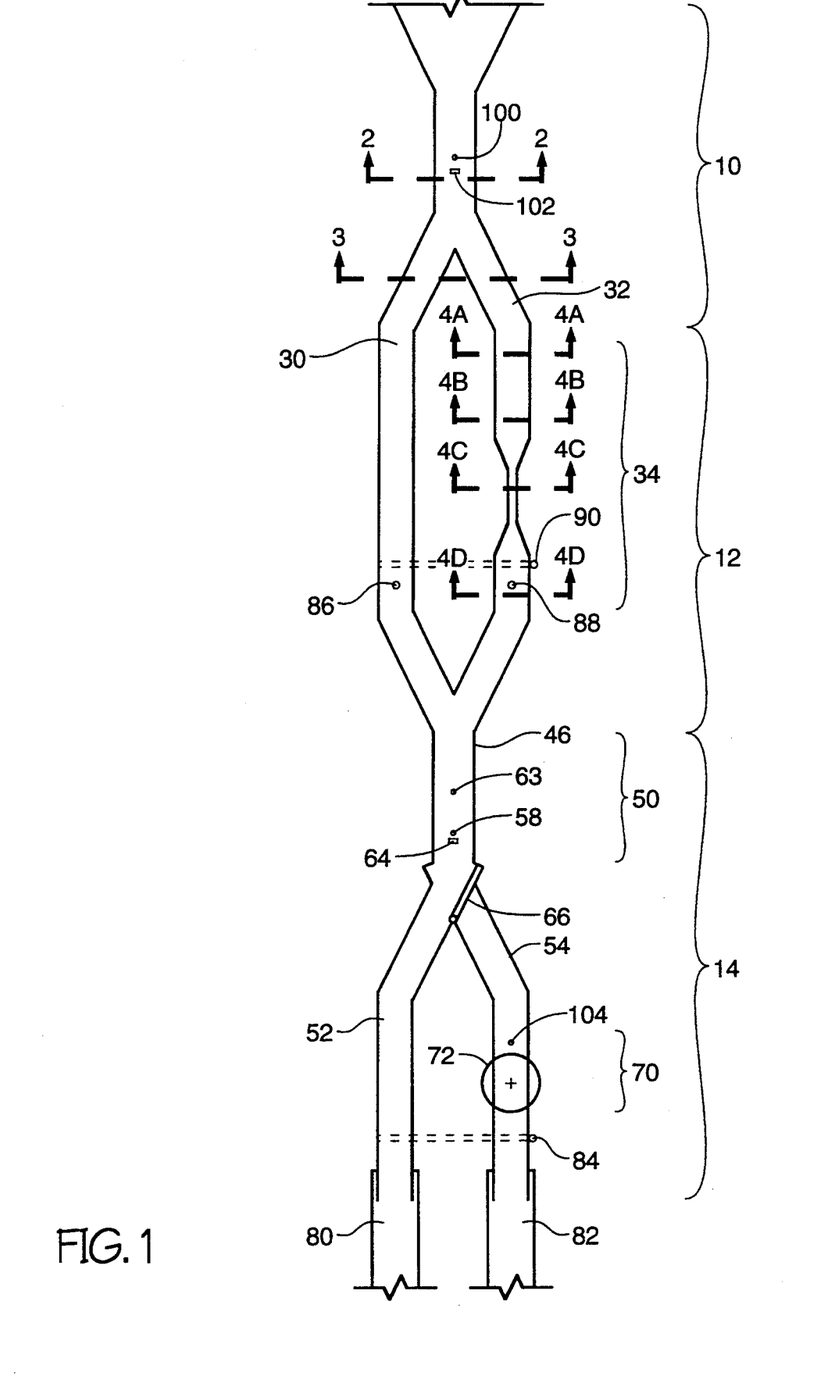
FIG. 1 is a top view of one embodiment of the inventive device sorter.

One embodiment of the inventive sorter for orienting a plurality of integrated circuit devices comprised first 10, second 12, and third 14 sections as shown in the overview of FIG. 1. The sections were manufactured in the instant case from aluminum, but conceivably other materials would also function sufficiently. The material should have a smooth finish to allow the devices to slide easily therealong without damage to the device. It should be noted that the first, second, and third sections as described can be manufactured from a single piece of material, or from two or more pieces which are then assembled. The breakdown of the sorter into three sections is used as an aid in explaining the inventive sorter.

Figure 2:
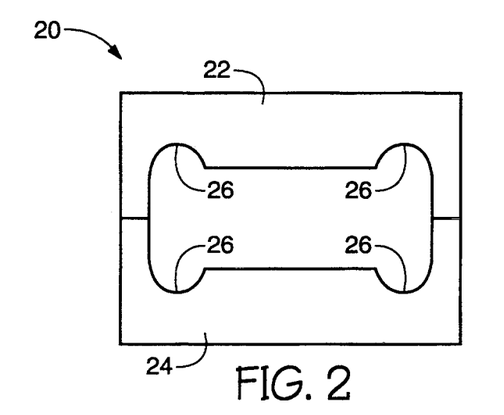
FIG. 2 is a cross section along "2—2" of the FIG. 1 embodiment.

Referring to the cross section of FIG. 2, the first section comprised an input 20 for receiving the semiconductor devices. The input comprised first 22 and second 24 opposing faces having a space therebetween for receiving the devices. The faces can be bolted, welded, or clamped together, and other means for connecting the faces are possible. The faces can also conceivably be manufactured as a single unit.

Each of the two faces comprised a lead channel 26 for receiving the leads on the semiconductor devices. The lead channels shown are for receiving small outline "J" (SOJ) leads and as such each face comprised a pair of lead channels. Other channels could also be manufactured to receive other styles of surface mount or through hole leads. The input received each of the devices, and the leads of the devices fit within the lead channels of either the first or second face. Therefore, the leads of devices having a leads up orientation were received by the lead channel of the first face 22, while the leads of devices having a leads down orientation were received by the lead channel of the second face 24.

Figure 3:
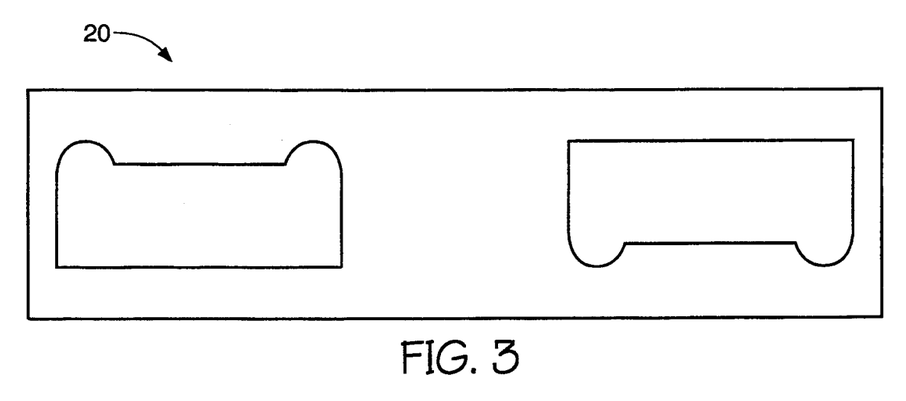
FIG. 3 is a cross section along "3—3" of the FIG. 1 embodiment.

During the manufacture of the inventive assembly, two identical faces were manufactured, then one was inverted and connected to the other. As the input continued along, the lead channels of the first and second faces became offset, and the devices slid along the input to become similarly offset to sort the devices by a leads up or a leads down orientation as shown in FIG. 3. The devices were thereby presented to the second section either with the leads down or the leads up. It should be noted that the pin one orientation at this point has not been examined, and pin one can either be forward or backward.

The second section 12 for the passage of the devices therethrough, which in this embodiment was connected to the first section, comprised first 30 and second 32 channels and means for reorienting the devices passing therethrough. The first channel 30 received devices which were received by the lead channel of the first face (devices having a leads up orientation) while the second channel 32 received devices which were received by the lead channel of the second face (devices having a leads down orientation). The devices in the first channel 30 of the second section 12 passed through the second section with no change in orientation. The devices in the second channel 32 must be reoriented (inverted) such that after passing through the first channel or the second channel the leads of the plurality of devices face one direction.

Figure 4A:
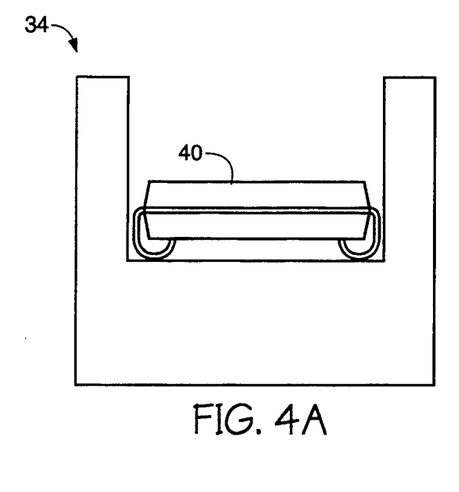
FIGS. 4A–4D show a device as it is inverted.
Figure 4B:
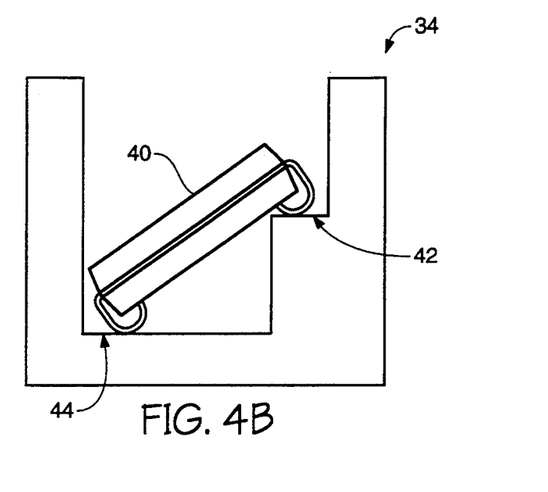
Figure 4C:
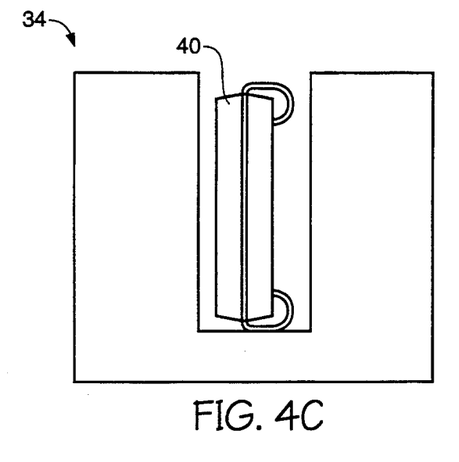
Figure 4D:
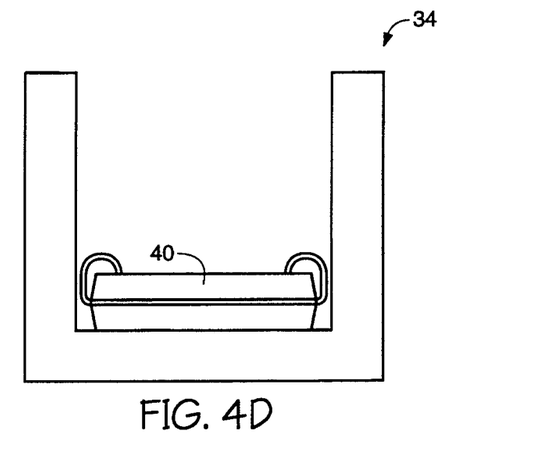

Means for reorienting the leads of devices passing through the second channel of the second section in the instant case was provided mechanically by an inverter 34, although mechanical means other than those described herein, or electrical means, may also be sufficient. FIGS. 4A–4D show cross sections of the inverter 34. FIG. 4A shows an uninverted device 40, and FIGS. 4B–4D show a device 40 as it progresses along the second channel 32 of the second section 12. The inverter of the second channel comprised a ramp 42 for raising one side of the device and a ramp 44 for lowering the other side of the device. As a device passed over the ramps, the left side was raised and the right side was lowered. The second channel narrowed and the device 40 was turned on its side in the channel, and the device was therefore rotated 90° as shown in FIG. 4C. As the device continued along the second channel, the second channel widened and the device rotated further to a leads up position. The channel can be manufactured with a lip which urges the device to continue rotating from 90°, however inertia and gravity sufficiently urged the device to reorient from 90° to a leads up position. Each device having a leads down orientation was thereby inverted, and the leads of the plurality of devices, after passing through the first channel or the second channel, faced one direction (leads up) as shown in FIG. 4D. In this case, the inverter was integral to said second channel, as the inverter was formed as a part of the second channel. Other inverters which are not integral to the second channel may also be possible. It may also be possible to provide a single ramp which lowers one or raises one side rather than using a pair of ramps. In any case, at a point below the inverter 34, the first and second channels rejoined into a single channel 46 as shown in FIG. 1.

The third section 14 for the passage of the devices therethrough, which in this embodiment was connected to the second section 12, comprised means 50 for determining an orientation of the front (pin one) end of one of the devices, and further comprised third 52 and fourth 54 channels. The third channel received devices having a front end with a first orientation, and the fourth channel received devices having a front end with a second orientation. Means at either the third or the fourth channel reoriented the front ends of the devices passing therethrough.

Figure 5:
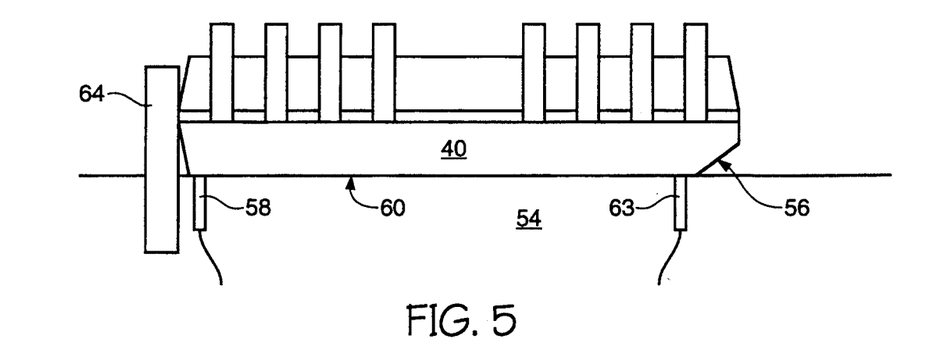
FIGS. 5 and 6 are side views of an optical sensor used to determine the pin one orientation of a device.
Figure 6:
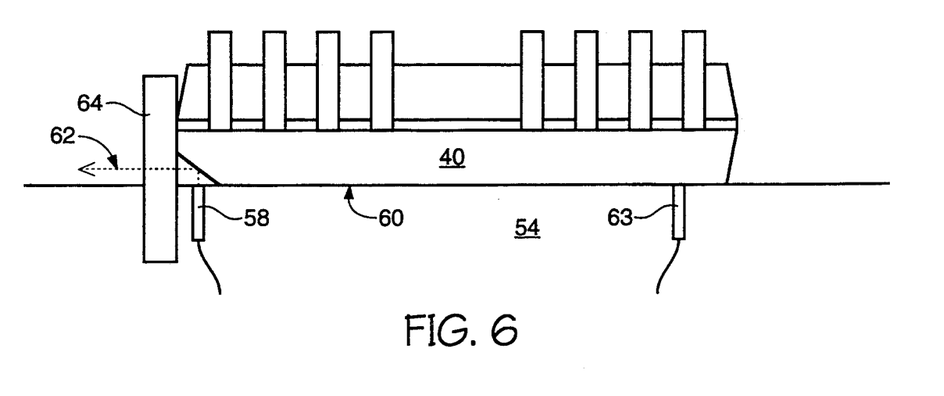

Means for determining the orientation of the front (pin one) end of the device was accomplished in this embodiment using a bevel 56 at the pin one end of the device 40 as an indicator. Semiconductor devices, and surface mount devices in particular, typically comprise this bevel 56 as a pin one indicator. A light emitter 58 was used to emit a light from the bottom of the channel 54 which reflected off the bevel 56 (if the front end was forward), or off the top 60 of the device 40 (if the back end was forward). If the bevel 56 was toward the back, an optical sensor 58 detected the light (not shown) reflected off the top 60 of the device 40 as shown in FIG. 5. If the bevel 56 was forward, then the light 62 was reflected away from the sensor 58 by the bevel 56, and no light was detected by the sensor 58 as shown in FIG. 6. In either case, the light emitter and the optical sensor formed a sensor for determining the orientation of the front end of the devices. A light emitter and optical sensor was provided in the instant case by a model PBT26U plastic fiber optic cable sensor available from Banner Engineering Corp. of Minneapolis, Minn., although a great number of other sensors would function sufficiently. This device comprised a light emitter and a sensor in a single unit, and thus the number "58" has been used to denote both the emitter and the sensor. An optical sensor 63 detected whether a device 40 was located at the stop bar 64. The device being tested was stopped by a stop bar 64 (a pin) protruding from the channel. After the device was tested, the stop bar 64 was retracted by activating a solenoid not shown) connected to the stop bar 54, and the device continued along the channel.

The means 50 for determining the orientation of the front end could also key on one of the other pin one indicators, such as by using a camera system to key in on some indicator such as a pin one mark on the device.

Figure 7:
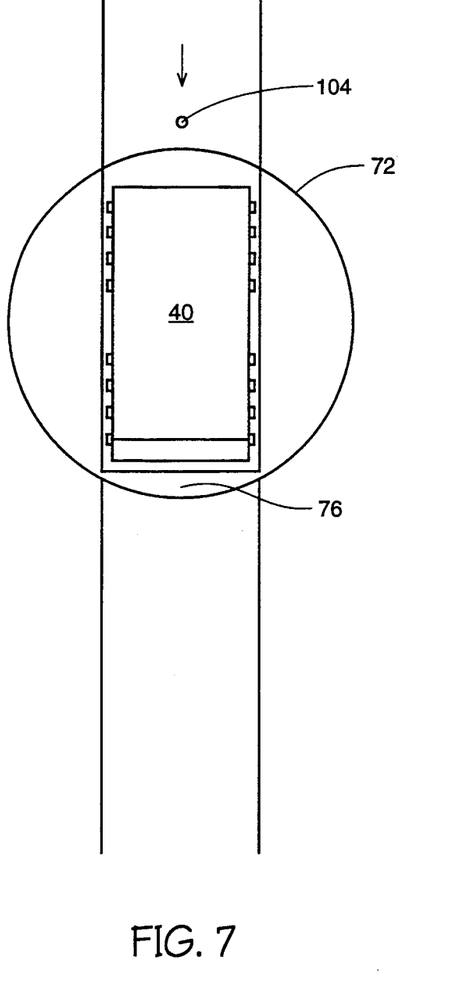
FIGS. 7–8 show the rotator of one embodiment of the invention.
Figure 8:
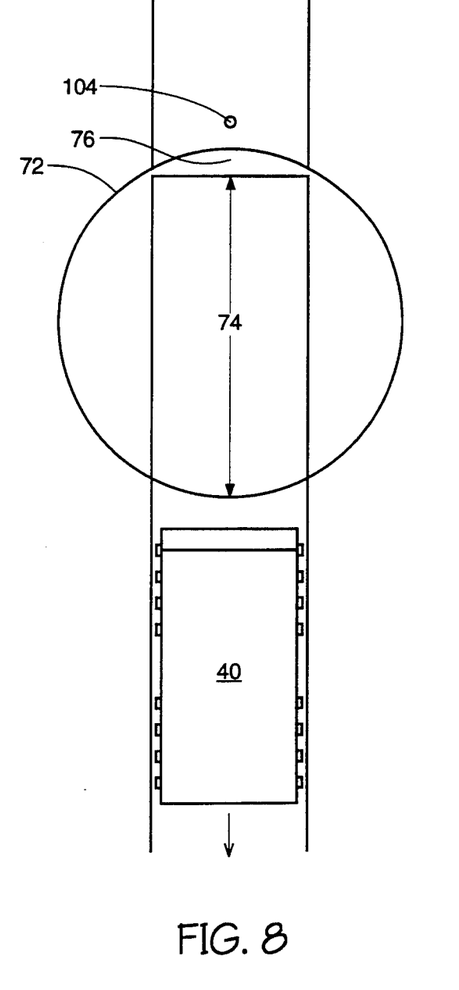

A selector arm 66 as shown in FIG. 1 controlled by a motor (not shown) was used as a diverter to direct each of the devices into either the third channel 52 or the fourth channel 54 after its pin one orientation was determined. The third channel received devices determined as having pin one up (facing backward), and the fourth channel received devices determined as having pin one down (facing forward). Responsive to the pin one orientation determined by sensor 58, a controller switched the selector 66 arm to direct the device into either the third 52 or the fourth 54 channel. The controller in the instant case was manufactured in-house using a 6803 microprocessor available from Motorola, Corp. of Schaumburg, Ill. configured for data acquisition and control, but numerous other controllers would function adequately. The means 70 for reorienting the front ends of the devices in the instant case comprised a rotating carousel 72 (a rotator) in the fourth channel 54 as shown in FIGS. 1, 7, and 8, the carousel being rotatable by the motor (not shown) through 180° and having a partial slot 74 for receiving the devices. A bar 76 across the slot prevented the device from passing through the channel without being rotated. A device 40 having pin one down entered the carousel 72 as shown in FIG. 7, and the carousel rotated 180° to the position shown in FIG. 8. The device dropped from the partial slot and continued on through the fourth channel of the third section, while the carousel rotated back to receive the next device. The devices already having pin one up continued through the third channel without being reoriented.

The third section further comprised first 80 and second 82 bins as shown in FIG. 1, with each of the bins connected to one of the third section channels. The bins received and stored the devices after the devices passed through the first and second channels of the third section. The bins in the instant case comprised storage tubes, but other bins may also be desirable.

The third section 14 further comprised an optical sensor 84 which allowed the controller to keep a count of devices passing through the third section. The controller would set off an alarm (either an audible or visual alarm) once one of the bins was full and another device was to be stored in the bin. An operator would then remove the full bin (the full tube), place another tube on the sorter, and restart the sorter.

At a point above the stop bar 64 of the third section 14 the controller used a vacuum system in conjunction with an optical sensor for detecting a device to slow or stop the devices as they passed through the section. This was done to protect the device from damage which might have occurred from the force of the device striking the stop bar. The vacuum system comprised a pair of holes 86, 88 through the material of the sorter. A pair of vacuum hoses (not shown) was connected to a back side of the sorter, with one hose to each hole. The optical sensor 90 comprised a model PIT46U, also available from Banner Engineering Corp., although other sensors would function adequately. As a device passed the optical sensor 90, a vacuum was applied to the hoses which transferred the vacuum through the holes 86, 88 to the channels 32, 34. If a device was to be slowed, the controller imparted the vacuum to the hoses. A device passing through a channel could be slowed by applying a vacuum for a short period of time, or by applying a weak continuous vacuum. The vacuum could also be used to stop the device instead of using the stop bar 64 previously described. To stop a device the vacuum could be applied continuously, and then released to allow the device to continue through the channel.

The vacuum system could be used, for example, to prevent a second device from entering the pin one sensor 58 while the pin one end of a first device was being determined. If the pin one end of a first device was being determined, and an optical sensor determined that a device was approaching the pin one sensor, a vacuum could applied to hold the device while the sensor was detecting whether the bevel was toward the front or back. This was not necessary with the instant embodiment, as a second device was not released into the input until a first device was binned.

The devices can be delivered to the input 10 by any means. In one embodiment a hopper was attached to the input. The hopper comprised a receptacle for holding a plurality of the devices, a channel along the bottom of the hopper, and a revolving conveyor belt at the channel. The function of the hopper was to stage a plurality of devices prior to delivery to the input, and to deliver each device to the input. The receptacle was wide at the top and tapered toward the channel at the bottom. As a device reached the hopper channel, it was urged toward an output aperture by the conveyor. The output aperture was connected to the first section input, and as a device reached the end of the conveyor it was delivered through the output aperture to the input.

This embodiment of the invention also comprised a number of other optical sensors which determined the location of a device passing through the sorter, as shown in FIG. 1. Optic 1 100 determined that a device was positioned at the input. A stop bar 102 at the first section 10 was retracted by the controller using a solenoid (not shown) to release the device. Optic 2 90 activated a vacuum when a device passed to prevent damage to the device as it struck stop bar 64. Optic 3 63 determined if a device was positioned at stop bar 64. It should be noted that after a device was first detected by optic 3 there was a delay of 12 milliseconds before testing for the pin one orientation was initiated to allow the device to become stationary. Optic 4 58 determined the pin one orientation of a device positioned at stop bar 64. Optic 5 104 determined that a device had entered the rotator 72, and the rotator was then activated by the controller to rotate the device. Finally, optic 6 84 was used by the controller to determine a count of devices entering each of the bins. Optics 1 and 3-5 were positioned in the bottom of the channel, while optics 2 and 6 were positioned horizontally across two channels. Optics 2 and 6 could each monitor two channels. Optic 4 58 was used by the controller to record which channel of the third section a device was delivered. Then as a device passed optic 6 the controller incremented a count of the number of devices in each bin. Once a bin was full, the controller sounded an alarm, and an operator replaced the tube.

The sorter was placed on a 42° angle, and it was found that gravity adequately moved the devices along the sorter, but not so rapidly as to damage the devices. The sorter may be placed on any angle which allows a device to travel through the sorter under the force of gravity. It may also be possible to provide some means other than gravity for moving the devices through the sorter, such as pneumatically.

Software used by the controller was written specifically for the inventive sorter by an in-house engineer. Sufficient software could be written by one of skill in the art from the information herein, and the flow charts provided in FIGS. 9-14 provide further information. Numerous other software architectures could function sufficiently with the inventive sorter.

Figure 9:
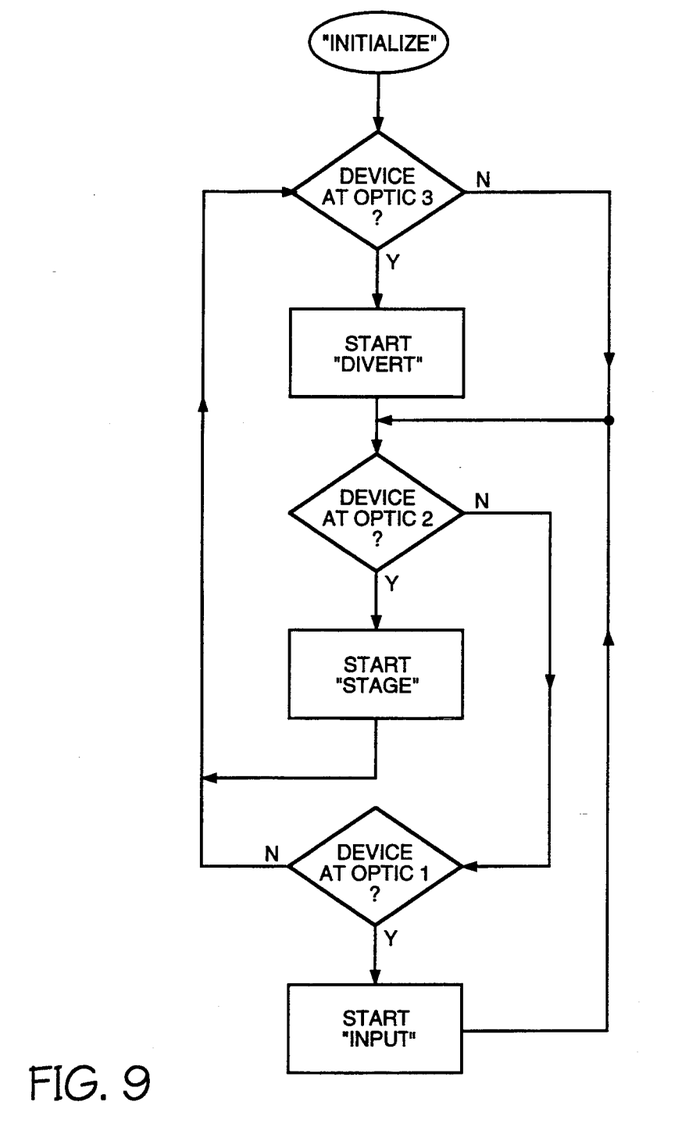
FIGS. 9–14 are flow charts showing software control of /ne embodiment of the inventive sorter.
Figure 10:
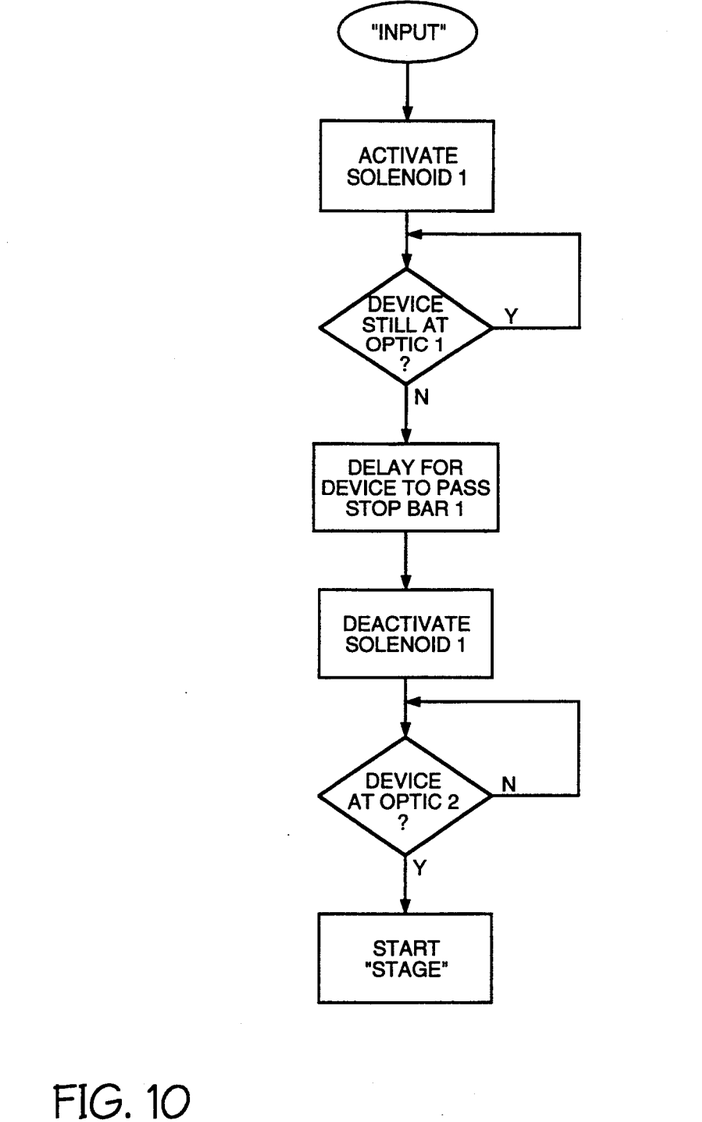
Figure 11:
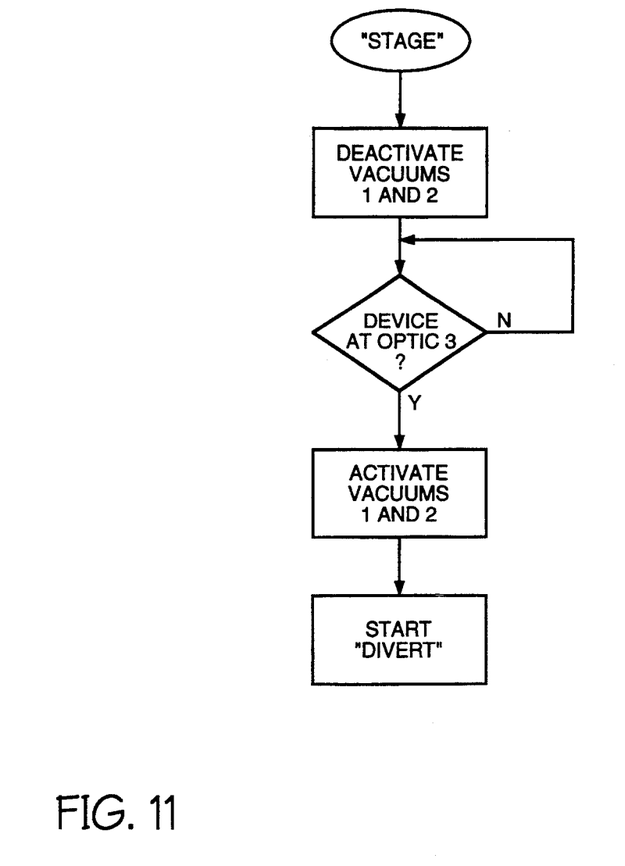
Figure 12:
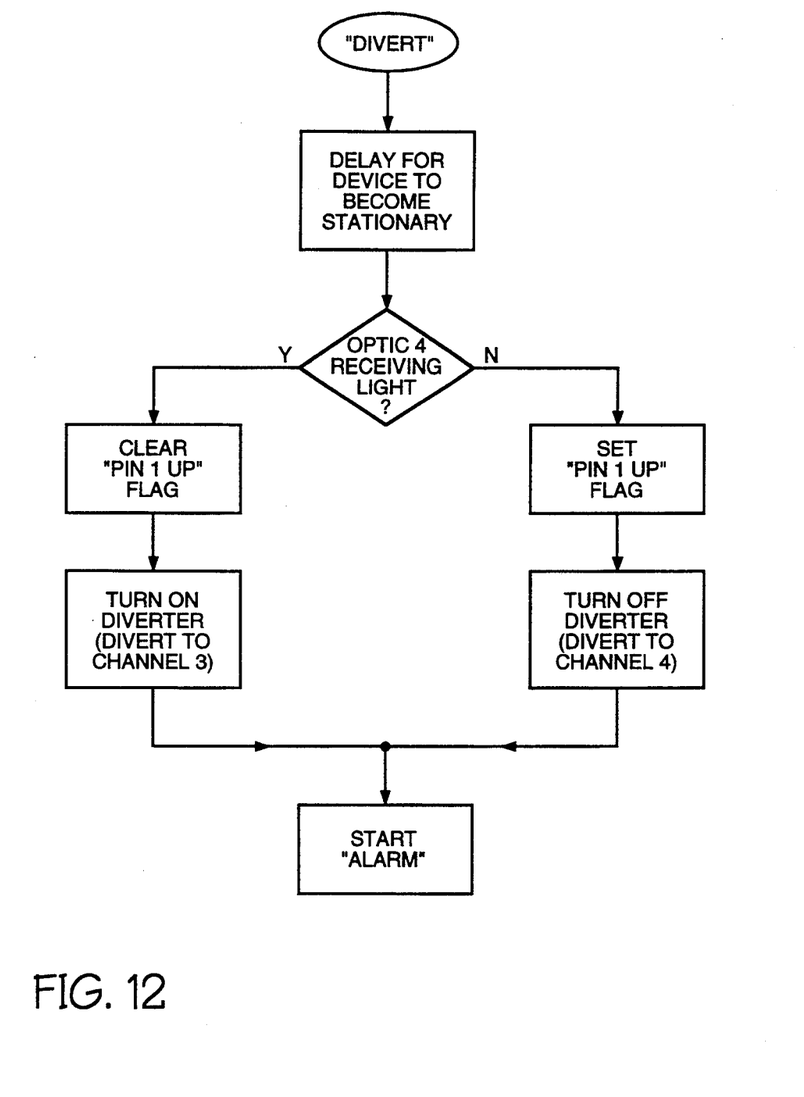
Figure 13:
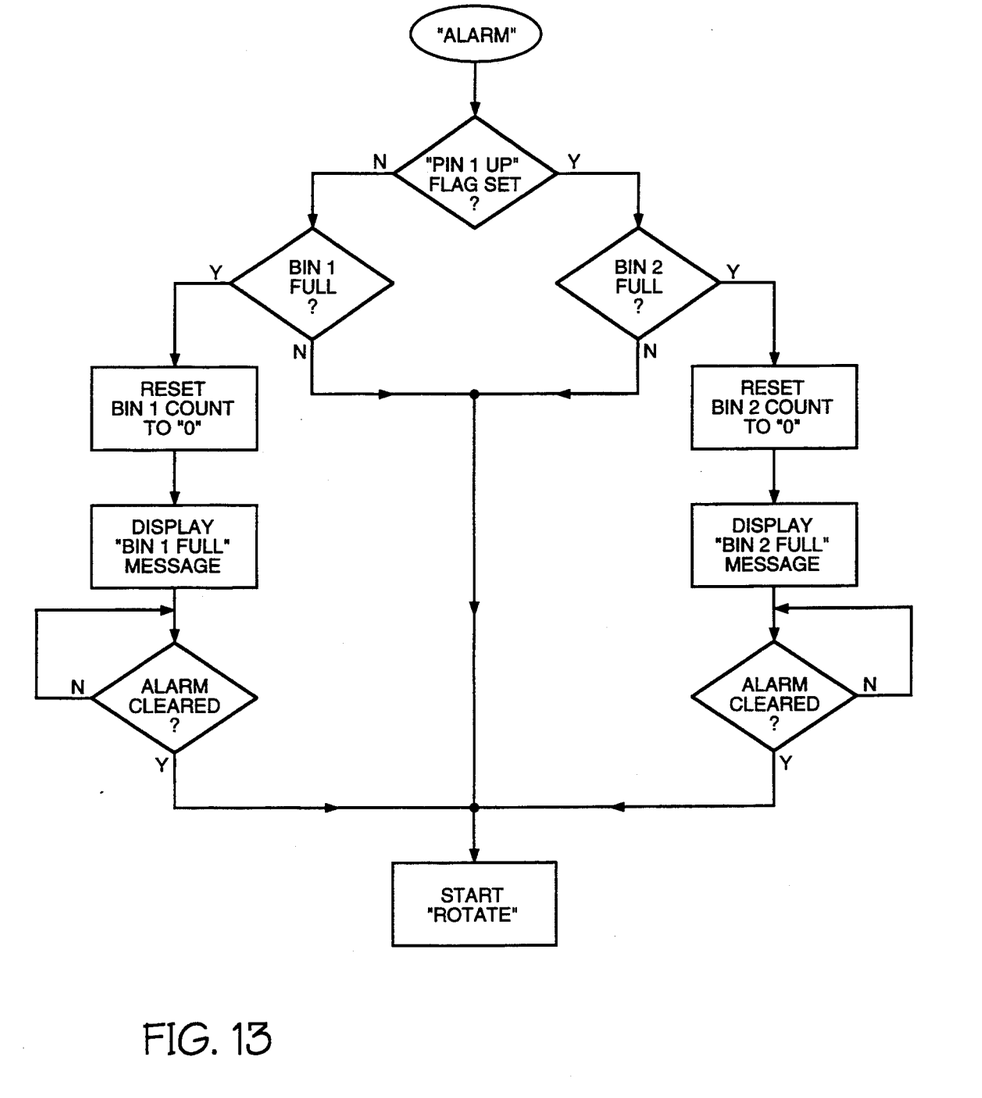
Figure 14:
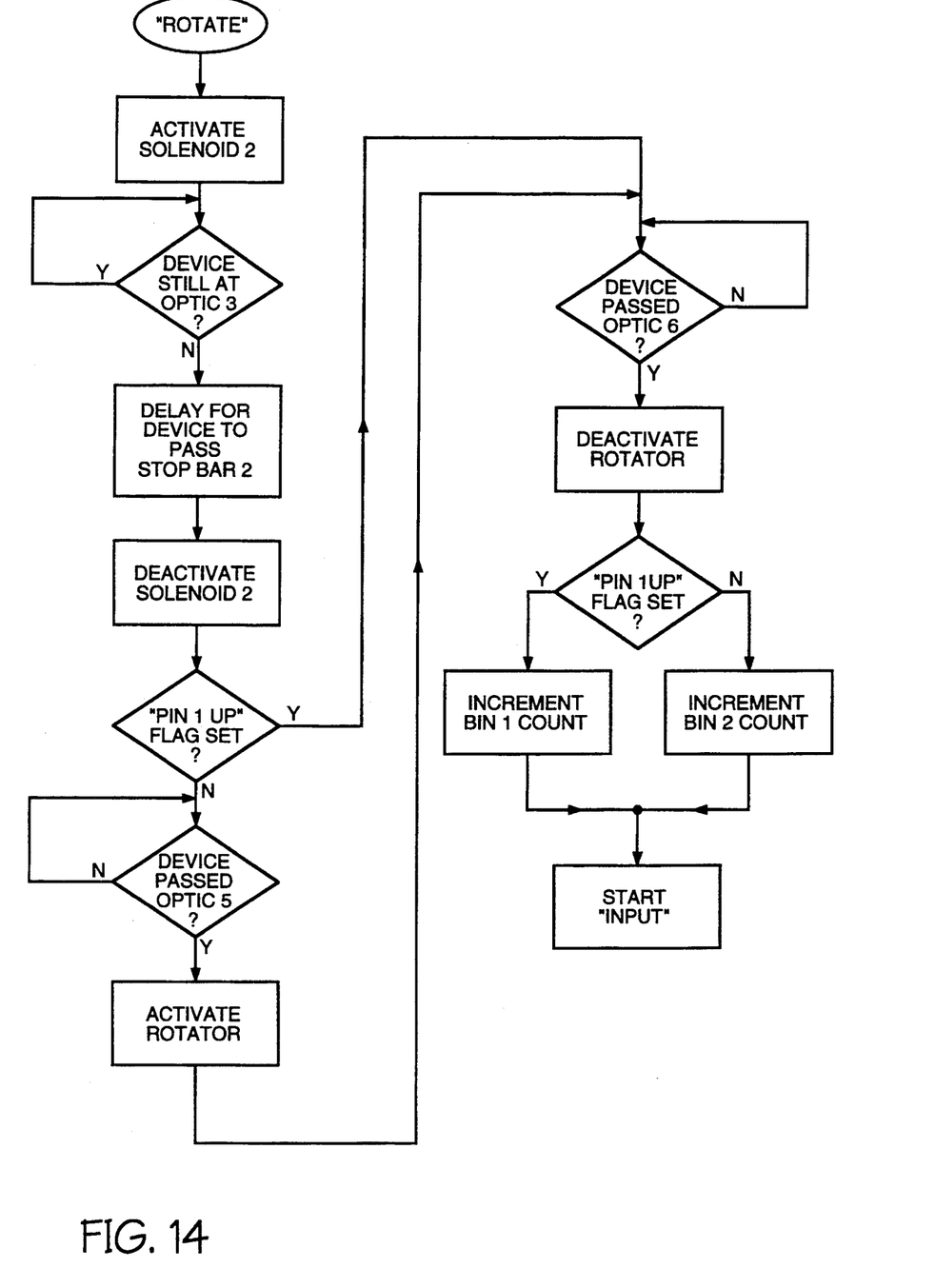

FIG. 9 describes the INITIALIZE routine which begins as the sorter is powered up. FIG. 10 describes the INPUT subroutine which delivers a device to the input. "SOLENOID 1" in FIG. 10 refers to the solenoid which controls stop bar 102 ("STOP BAR 1"). FIG. 11 shows the STAGE subroutine which deactivates vacuum 1 86 and vacuum 2 88 at the first 30 and second 32 channels of the second section 12. The vacuums slowed the device at optic 2 90 to prevent wire bond and other damage to the device from striking the stop bar 2 64 at optic 3 63. FIG. 12 illustrates the DIVERT subroutine which determines the pin one orientation of the device from optic 4 58, as shown in FIGS. 5 and 6. FIG. 13 describes the ALARM subroutine which is activated if one of the bins are full. FIG. 14 shows the ROTATE subroutine which rotates a device having a pin one down orientation using the rotator 72 of FIGS. 7 and 8. "SOLENOID 2" in FIG. 14 refers to the solenoid which controls stop bar 64 ("STOP BAR 2"). ROTATE also increments the count of devices entering each of the bins.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A sorter for orienting a plurality of integrated circuit devices, each of said devices having a top, a bottom opposite said top, a front end, a back end opposite said front end, and leads, said sorter comprising:
   a) a first section comprising an input for receiving said devices, said input comprising first and second opposing faces having a space therebetween for receiving said devices, each of said faces having a lead channel for receiving said leads on one of said devices;
   b) a second section for the passage of said plurality of devices therethrough, comprising:
      i) a first channel for receiving devices received by said lead channel of said first face;
      ii) a second channel for receiving devices received by said lead channel of said second face;
      wherein one of said second section channels comprises means for reorienting said devices passing therethrough, such that after passing through said first channel or said second channel said leads of said plurality of devices face one direction;
   c) a third section for the passage of said plurality of devices therethrough, comprising:
      i) means for determining an orientation of said front end of one of said devices;
      ii) a third channel for receiving devices having a front end with a first orientation;
      iii) a fourth channel for receiving devices having a front end with a second orientation;
      iv) means at one of said third section channels for reorienting said front ends of said devices passing therethrough.

2. The sorter of claim 1 wherein each of said devices further comprises a first side and a second side opposite said first side, and wherein said means for reorienting said devices comprises a ramp for raising said first side such that said devices are reoriented in said second channel after passing over said ramp of said second channel.

3. The sorter of claim 1 wherein each of said devices further comprises a bevel at said front end, and said means for determining an orientation of said front end of one of said devices comprises:
   a) a light emitter emitting a light;
   b) an optical sensor for detecting said light;
   wherein said light, when reflected off said bevel, is reflected away from said sensor, said sorter thereby determining an orientation of said front end of said device.

4. The sorter of claim 1 wherein said means for reorienting said front ends comprises a rotating carousel having a slot for receiving one of said devices, said carousel being rotatable through 180°.

5. The sorter of claim 1 wherein said third section further comprises first and second bins, each of said bins connected to one of said third section channels, said bins receiving and storing said devices after said devices pass through said third section.

6. The sorter of claim 5 further comprising a counter at said third section for determining a count of devices passing through said third section.

7. The sorter of claim 1 further comprising a vacuum system for slowing devices as they pass through at least one of said sections.

8. A sorter for orienting a plurality of integrated circuit devices, each of said devices having a top, a bottom opposite said top, a front end, a back end opposite said front end, and leads, said sorter comprising:
   a) a first section comprising an input for receiving said devices, said input comprising first and second opposing faces having a space therebetween for receiving said devices, each of said faces having a pair of lead channels for receiving said leads on one of said devices;
   b) a second section connected to said first section, said second section comprising:
      i) a first channel for receiving devices received by said lead channel of said first face;
      ii) a second channel for receiving devices received by said lead channel of said second face;
      wherein one of said second section channels comprises an inverter for reorienting devices passing therethrough, such that after passing through said first channel or said second channel said leads of said plurality of devices face one direction;
   c) a third section connected to said second section, comprising:
      i) a sensor for determining an orientation of said front end of one of said devices;
      ii) a third channel for receiving devices having a front end with a first orientation;
      iii) a fourth channel for receiving devices having a front end with a second orientation;
      iv) a rotator at one of said third section channels for reorienting said front ends of said devices passing therethrough.

9. The sorter of claim 8 wherein each of said devices further comprises a first side and a second side opposite said first side, and wherein said inverter comprises a ramp for raising said first side such that said devices are reoriented in said second channel after passing over said ramp of said second channel.

10. The sorter of claim 8 wherein each of said devices further comprises a bevel at said front end, and said sensor comprises:
    a) a light emitter emitting a light;
    b) an optical sensor for detecting said light;
    wherein said light, when reflected off said bevel, is reflected away from said optical sensor, said sorter thereby determining an orientation of said front end of said device.

11. The sorter of claim 8 wherein said rotator comprises a rotating carousel having a slot for receiving one of said devices, said carousel being rotatable through 180°.

12. The sorter of claim 8 wherein said third section further comprises first and second bins, each of said bins connected to one of said third section channels, said bins receiving and storing said devices after said devices pass through said third section.

13. The sorter of claim 12 further comprising a counter at said third section for determining a count of devices passing through said third and fourth channels.

14. The sorter of claim 8 further comprising a vacuum system for slowing devices as they pass through at least one of said sections.

15. A sorter for orienting a plurality of integrated circuit devices, each of said devices having a top, a bottom opposite said top, a pin one end, a back end opposite said pin one end, and leads, said sorter comprising:
   a) a first section comprising an input for receiving said devices, said input comprising:
      i) a first face having a pair of lead channels, said first face lead channels receiving said leads of devices having a leads up orientation;
      ii) a second face identical to said first face and opposing said first face, said second face comprising lead channels receiving said leads of devices having a leads down orientation;
      iii) said first and second faces having a space therebetween for receiving said devices;
   wherein said first section sorts said devices into leads down and leads up orientations;
   b) a second section connected to said first section, said second section comprising:
      i) a first channel for receiving devices from said first section having a leads up orientation;
      ii) a second channel for receiving devices from said first section having a leads down orientation;
      iii) an inverter integral to said second channel for inverting devices passing therethrough to a leads up orientation;
   wherein after passing through said second section each of said devices has a leads up orientation;
   c) a third section connected to said second section, comprising:
      i) a sensor for determining an orientation of said pin one end of one of said devices;
      ii) a third channel for receiving devices having a pin one up orientation;
      iii) a fourth channel for receiving devices having a pin one down orientation;
      iv) a rotator integral to said fourth channel for rotating devices passing therethrough to a pin one up orientation.

16. The sorter of claim 15 wherein each of said devices further comprises a first side and a second side opposite said first side, and wherein said inverter comprises a ramp for raising said first side such that said devices are reoriented in said second channel after passing over said ramp of said second channel.

17. The sorter of claim 15 wherein each of said devices further comprises a bevel at said pin one end, and said sensor comprises:
   a) a light emitter emitting a light;
   b) an optical sensor for detecting said light;
   wherein said light, when reflected off said bevel, is reflected away from said optical sensor, said sorter thereby determining an orientation of said pin one end of said device.

18. The sorter of claim 15 wherein said rotator comprises a rotating carousel having a slot for receiving one of said devices, said carousel being rotatable through 180°.

19. The sorter of claim 15 wherein said third section further comprises first and second bins, each of said bins connected to one of said third section channels, said bins receiving and storing said devices after said devices pass through said third section.

20. The sorter of claim 19 further comprising a counter at said third section for determining a count of devices passing through said third and fourth channels.

21. The sorter of claim 15 further comprising a vacuum system for slowing devices as they pass through at least one of said sections.

* * * * *